(12) United States Patent
Nakamura et al.

(10) Patent No.: US 11,056,323 B2
(45) Date of Patent: Jul. 6, 2021

(54) SPUTTERING APPARATUS AND METHOD OF FORMING FILM

(71) Applicant: ULVAC, INC., Kanagawa (JP)

(72) Inventors: Shinya Nakamura, Kanagawa (JP); Yukihito Tashiro, Kanagawa (JP)

(73) Assignee: ULVAC, INC., Kanagawa (JP)

( * ) Notice: Subject to any disclaimer, the term of this patent is extended or adjusted under 35 U.S.C. 154(b) by 0 days.

(21) Appl. No.: 16/468,521

(22) PCT Filed: Oct. 11, 2018

(86) PCT No.: PCT/JP2018/037846
§ 371 (c)(1),
(2) Date: Jun. 11, 2019

(87) PCT Pub. No.: WO2019/087724
PCT Pub. Date: May 9, 2019

(65) Prior Publication Data
US 2020/0080192 A1    Mar. 12, 2020

(30) Foreign Application Priority Data
Nov. 1, 2017 (JP) .............................. JP2017-212188

(51) Int. Cl.
| H01J 37/34 | (2006.01) |
| C23C 14/34 | (2006.01) |
| C23C 14/35 | (2006.01) |

(52) U.S. Cl.
CPC ...... *H01J 37/3455* (2013.01); *C23C 14/3407* (2013.01); *C23C 14/35* (2013.01);
(Continued)

(58) Field of Classification Search
CPC .. H01J 37/3455; H01J 37/3452; H01J 37/345; H01J 37/3491; H01J 37/3266;
(Continued)

(56) References Cited

U.S. PATENT DOCUMENTS

| 2004/0163951 A1 | 8/2004 | Iseki |
| 2005/0274610 A1 | 12/2005 | Iseki |

(Continued)

FOREIGN PATENT DOCUMENTS

| JP | 02115365 A | * | 4/1990 |
| JP | 08-253859 A | | 10/1996 |

(Continued)

OTHER PUBLICATIONS

Machine Translation JP 11217669 A (Year: 1999).*
Derwent Abstract of JP 04293770 A (Year: 1992).*

*Primary Examiner* — Michael A Band
(74) *Attorney, Agent, or Firm* — Cermak Nakajima & McGowan LLP; Tomoko Nakajima

(57) ABSTRACT

A sputtering apparatus is provided with: a vacuum chamber having a target manufactured by sintering raw material powder; a magnet unit having a plurality of magnets disposed on the same surface above the target which is mounted on the vacuum chamber in a non-rotatable manner, in order to cause leakage magnetic field penetrating the target to function in uneven distribution on the sputtering surface; a rotary shaft which is disposed on the center line passing through the center of the target and is coupled to the magnet unit; and a drive motor for driving the rotary shaft to rotate, thereby rotating the magnet unit such that a function region of the leakage magnetic field on the sputtering surface revolves about an imaginary circle with the center of the target serving as the center.

2 Claims, 5 Drawing Sheets

(52) U.S. Cl.
CPC ......... *H01J 37/345* (2013.01); *H01J 37/3411* (2013.01); *H01J 37/3452* (2013.01)

(58) Field of Classification Search
CPC . H01J 37/32669; H01J 37/3411; C23C 14/35; C23C 14/3407
See application file for complete search history.

(56) References Cited

U.S. PATENT DOCUMENTS

| | | |
|---|---|---|
| 2015/0136596 A1 | 5/2015 | Nakamura et al. |
| 2015/0235817 A1 | 8/2015 | Goto |
| 2016/0020169 A1 | 1/2016 | Matsuda |

FOREIGN PATENT DOCUMENTS

| | | | | | |
|---|---|---|---|---|---|
| JP | 11021666 A | * | 1/1999 | .......... | H01J 37/3455 |
| JP | 11217669 A | * | 8/1999 | | |
| JP | 2004-143594 A | | 5/2004 | | |
| JP | 2005-336520 A | | 12/2005 | | |
| JP | 2016-025141 A | | 2/2016 | | |
| WO | WO2013/179548 A1 | | 12/2013 | | |
| WO | WO2014/064741 A1 | | 5/2014 | | |

\* cited by examiner

SPUTTERING APPARATUS AND METHOD OF FORMING FILM

This application is a national phase entry under 35 U.S.C. § 371 of PCT Patent Application No. PCT/JP2018/037846, filed on Oct. 11, 2018, which claims priority under 35 U.S.C. § 119 to Japanese Patent Application No. 2017-212188, filed Nov. 1, 2017, both of which are incorporated by reference.

TECHNICAL FIELD

The present invention relates to a sputtering apparatus and a method of forming a film and relates, in particular, to those which are suitable for film formation by sputtering a sintered target.

BACKGROUND ART

As a large-capacity semiconductor device there is known a 3D (three-dimensional)-NAND flash memory which is made by laminating memory cells in a vertical direction. In the manufacturing steps of the 3D-NAND flash memory there is, e.g., a step of forming an aluminum oxide film as an etching-stop layer (for example, see Patent Document 1). In forming this kind of aluminum oxide film, a sputtering apparatus is ordinarily used. As this kind of sputtering apparatus, there is used a magnetron type of apparatus in which a magnet unit which is disposed on a side to align with a sputtering surface of a target is rotated with the center of the target serving as a center of rotation. Further, as the target for use in a sputtering apparatus, a target made by sintering aluminum oxide powder is generally used.

Now, when a film is formed on the surface of the substrate by sputtering this target by using a sputtering apparatus having a target that is manufactured by sintering raw material powder, it has been found that there locally occur regions in which the film thickness becomes thinner in the substrate in-plane. The presence of this kind of regions of thinner film thicknesses will be a hindrance to an attempt in increasing the uniformity of film thickness distribution. Therefore, it is necessary to keep this kind of regions from occurring to the best extent possible. Then, as a result of strenuous studies, the inventors of this invention have obtained the finding in: that, when a target was manufactured by sintering raw material powder, there locally occurred a region in which the density was low in the target in-plane for some reasons or other in the course of manufacturing the target and in; that, due to this phenomenon, the sputtering rate (the amount of sputtered particles that are dispersed out of the target surface per unit time) was locally lowered in the regions of relatively lower density when the target was sputtered.

PRIOR ART DOCUMENTS

Patent Documents

Patent Document 1: JP-2016-25141-A

SUMMARY OF THE INVENTION

Problems that the Invention is to Solve

This invention has been made based on the above-mentioned finding, and has a problem of providing a sputtering apparatus and a method of forming a film which are capable of forming a film on the surface of the substrate with good film thickness distribution at the time of forming the film by using a sintered target and sputtering this sintered target.

Means for Solving the Problems

In order to solve the above-mentioned problems, the sputtering apparatus according to this invention comprises: a vacuum chamber having a target manufactured by sintering raw material powder; provided that such a surface of the target as is eroded by sputtering is defined as a sputtering surface that a thickness direction of the target is defined as a vertical direction and that the target is non-rotatably mounted on the vacuum chamber in a posture in which the sputtering surface looks downward, a magnet unit having a plurality of magnets disposed on the same surface above the target in order to cause leakage magnetic field penetrating the target to function in uneven distribution on the sputtering surface; a rotary shaft disposed on a center line passing through the center of the target for further coupling to the magnet unit; a drive motor for driving the rotary shaft to rotate, thereby rotating the magnet unit such that a function region of the magnetic field on the sputtering surface revolves about an imaginary circle with the center of the target serving as the center. The sputtering apparatus further comprises a tilting means for tilting the rotary shaft relative to the center line such that each of the magnets is moved toward or away from the upper surface of the target depending on a density distribution of the target at the time of sintering the raw material powder.

According to this invention, even if there locally exists a region in which the density is low in the target in-plane for some reasons or other in the course of manufacturing, the following measures can be taken by tilting the rotary shaft relative to the center line. In other words, when the magnet passes above the region in which the density is low, the distance between the magnet and the target is made relatively short and, when the magnet passes above the other regions, the distance between the magnet and the target is made relatively long. Depending on the target density, by thus varying the intensity of the leakage magnetic field that functions on the target, the sputtering rate over the entire circumferential direction when the magnet unit revolves about the imaginary circle can be made substantially uniform. As a result, when the sintered target is sputtered to thereby form a film on the surface of the substrate, the uniformity of the film thickness distribution in the substrate in-plane can further be improved. By the way, in case the intensity of the leakage magnetic field to function on the target is locally varied, it may be considered to appropriately dispose a so-called magnetic shunt. However, since it cannot easily be recognized visually or the like which particular region in the target corresponds to the region in which the density is low, the idea of disposing the magnetic shunt is not practical.

In this invention, there may be employed an arrangement in which the tilting means comprises: a base plate having formed therethrough a central opening through which the rotary shaft is inserted; a tilting plate for supporting that upper portion of the rotary shaft which protrudes upward beyond the base plate; at least three tilting shafts vertically disposed on the lower surface of the tilting plate at a circumferential distance from one another; and a drive unit, disposed on the base plate, for tilting the tilting plate relative to the center line through each of the tilting shafts. In the arrangement, the drive unit comprises: a first block having a tilted surface and disposed on the base plate so as to be movable by an actuator along the base plate; a second block which vertically displaces along the tilted surface of the first block as a result of movement of the first block; an accepting portion which is disposed in the second block so as to swingably receive a lower end of the tilting shaft, such that as a result of movement, in one direction, of any one of the accepting portions due to a reaction force accompanied by the vertical displacement of the other second block, the tilting shaft is arranged to swing. According to this arrangement, when the second block moves vertically upward or downward as a result of movement of the first block, the tilting shaft swings so that the tilting plate tilts. In response to these movements, the rotary shaft also tilts relative to the center line. When the magnet unit is rotated in this state about the rotary shaft, there can be materialized an arrangement in which, when the magnet passes, e.g., above the region in which the density is low, the distance between the magnet and the target can be made relatively short and in which, when the magnet passes above the other regions, the distance between the magnet and the target can be made relatively long.

Further, in order to solve the above-mentioned problems, this invention is a method of forming a film comprising: disposing inside a vacuum chamber a target manufactured by sintering raw material powder, and a substrate to be processed; introducing a sputtering gas into the vacuum chamber; and sputtering the target by applying electric power to the target such that sputtered particles dispersed from the target are caused to be adhered to and deposited on a surface of the substrate to be processed. Provided: that such a surface of the target as is eroded by sputtering is defined as a sputtering surface; that a thickness direction of the target is defined as a vertical direction; and that the direction in which the sputtering surface faces is defined to be downward, the method further comprises: causing leakage magnetic field penetrating the target to function in uneven distribution on the sputtering surface by a magnet unit having a plurality of magnets disposed on the same surface above the target; during film forming by sputtering, revolving the magnet unit about a rotary shaft to be disposed on a center line passing through the target center such that the function region of the leakage magnetic field relative to the sputtering surface revolves about an imaginary circle with the target center as the center thereof. This method comprises: the step of obtaining, prior to the film forming by sputtering, a density distribution of the target; and the step of tilting the rotary shaft relative to the center line such that the distance between the region in which the target density is low and the magnet becomes relatively short, and that the distance between the other regions and the magnet becomes relatively long. In this case, the target density distribution is calculated based on a film thickness distribution of a thin film formed on the surface of the substrate to be processed.

MODES FOR CARRYING OUT THE INVENTION

Figure 1:
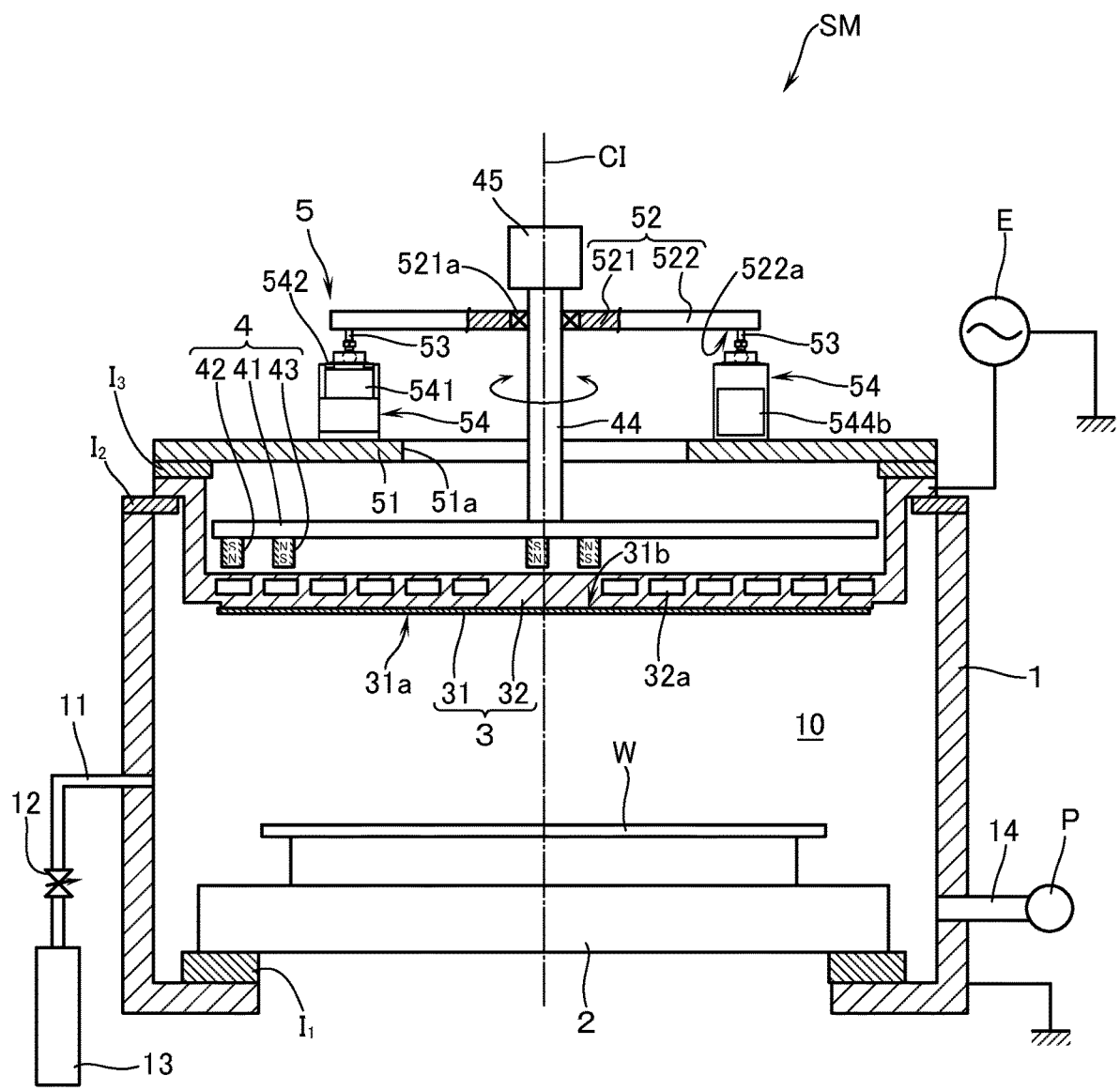
FIG. 1 is a schematic sectional view showing a sputtering apparatus according to an embodiment of this invention.

Hereinbelow, with reference to the drawings, a description will now be made of a method of forming a film and a sputtering apparatus according to an embodiment of this invention by taking an example in which: a substrate W to be processed is a silicon substrate (hereinafter referred to as "substrate W"), and a target is of aluminum oxide that is manufactured by sintering raw material powder, and an aluminum oxide film as an insulating film is formed on the surface of the substrate W. In the following, the film forming process is supposed to be performed in a posture as shown in FIG. 1. The terms referring to the direction such as upper, lower, and the like are based on FIG. 1.

With reference to FIG. 1, reference mark SM refers to a magnetron sputtering apparatus. This sputtering apparatus SM is provided with a vacuum chamber 1 which defines a processing chamber 10. The side wall of the vacuum chamber 1 has connected thereto a gas pipe 11 for introducing a sputtering gas. The gas pipe 11 is in communication with a gas source 13 through a mass flow controller 12. As the sputtering gas, aside from rare gas such as argon and the like, reactive gas such as oxygen gas, vapor gas and the like may be selected in case reactive sputtering is performed. The side wall of the vacuum chamber 1 has connected thereto an exhaust pipe 14 which is in communication with an evacuating means P which is made up of a turbo-molecular pump, rotary pump, and the like. It is thus so arranged that, after having evacuated the processing chamber 10 to a predetermined pressure, the sputtering gas whose flow has been controlled by the mass flow controller 12 is introduced into the processing chamber 10 and, as a consequence, that the pressure in the processing chamber 10 can be maintained substantially constant.

At the lower portion of the vacuum chamber 1 there is disposed a stage 2 through an insulating material 11. The stage 2 has a known electrostatic chuck (not illustrated). It is thus so arranged that, by applying chuck voltage from a chuck power source to an electrode of the electrostatic chuck, the substrate W can be held on the stage 2 by suction with a film-forming surface of the substrate W facing upward. At an upper portion of the vacuum chamber 1 there is disposed a target assembly 3. The target assembly 3 is constituted by a target 31, and a backing plate 32 which is bonded to the upper surface of the target 31 through a bonding agent (not illustrated) such as indium and the like. The peripheral portion of the backing plate 32 is mounted on the upper portion of the vacuum chamber 1 through an insulating material 12, in a posture in which the sputtering surface 31a of the target 31 looks downward. By the way, as to the method itself of manufacturing the target 31, known art can be made use of and therefore detailed description thereof is omitted here. Further, the backing plate 32 has formed therein a coolant circulation passage 32a and it is thus so arranged that the target 31 can be cooled during film forming process by sputtering. The target 31 is arranged to have connected thereto, through the backing plate 32, an output of radio frequency power supply as a sputtering power source E so that radio frequency power can be applied to the target 31. It is to be noted that the sputtering power source E may be appropriately selected depending on the kind of the target 31 and that DC power source, DC pulse power source, and the like may be made use of.

A magnet unit 4 is disposed above the target assembly 3. It is thus so arranged: that leakage magnetic field is caused to be locally functioned below the sputtering surface 31a of the target 31; and that electrons and the like electrolytically dissociated below the sputtering surface 31a during film forming by sputtering are captured to thereby efficiently ionize the sputtered particles dispersed from the target 31. The magnet unit 4 has: a disc-shaped yoke 41; a plurality of first magnets 42 circularly arranged on the lower surface of the yoke 41; and a plurality of second magnets 43 circularly arranged in a manner to enclose the circumference of the first magnets 42. By the way, the arrangement of these magnets may make use of the known art. To the center of the upper surface of the yoke 41 there is connected a rotary shaft 44 positioned in the center line C1 that passes through the center of the target 31. It is thus so arranged that, by driving this rotary shaft 44 to rotate by a drive motor 45, the function region of the leakage magnetic field on the sputtering surface 31a revolves about an imaginary circle around the center of the target 31.

Figure 3:
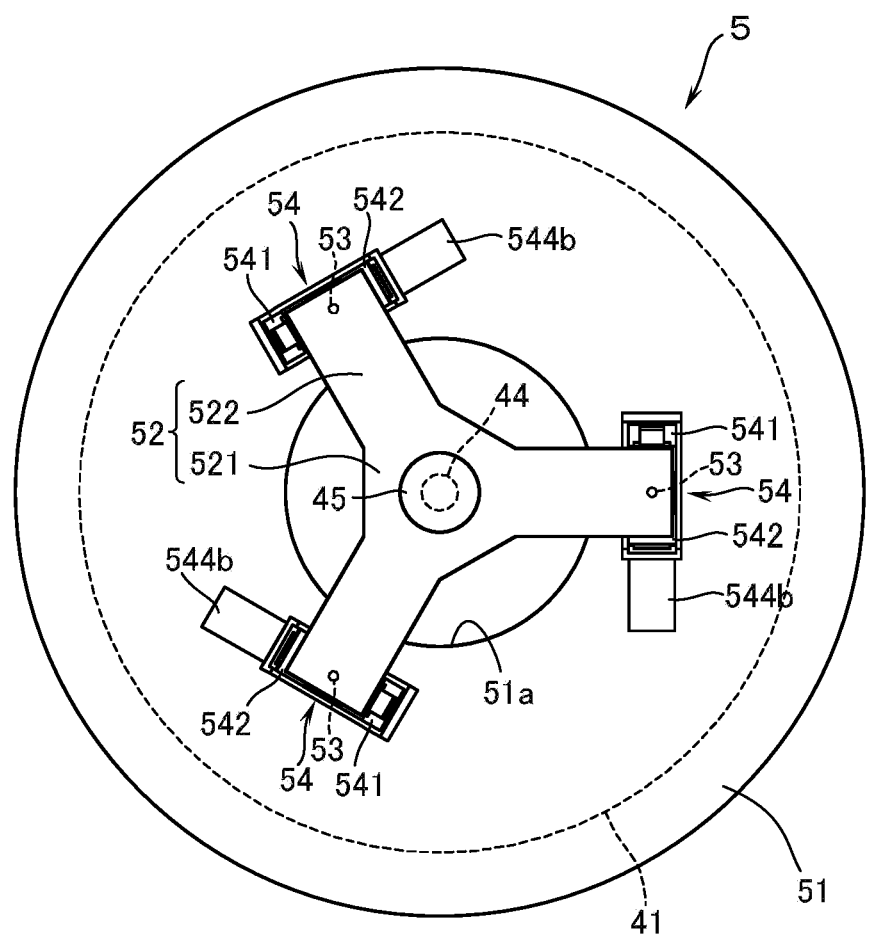
FIG. 3 is a schematic plan view showing the tilting means as shown in FIG. 2.
Figure 4:
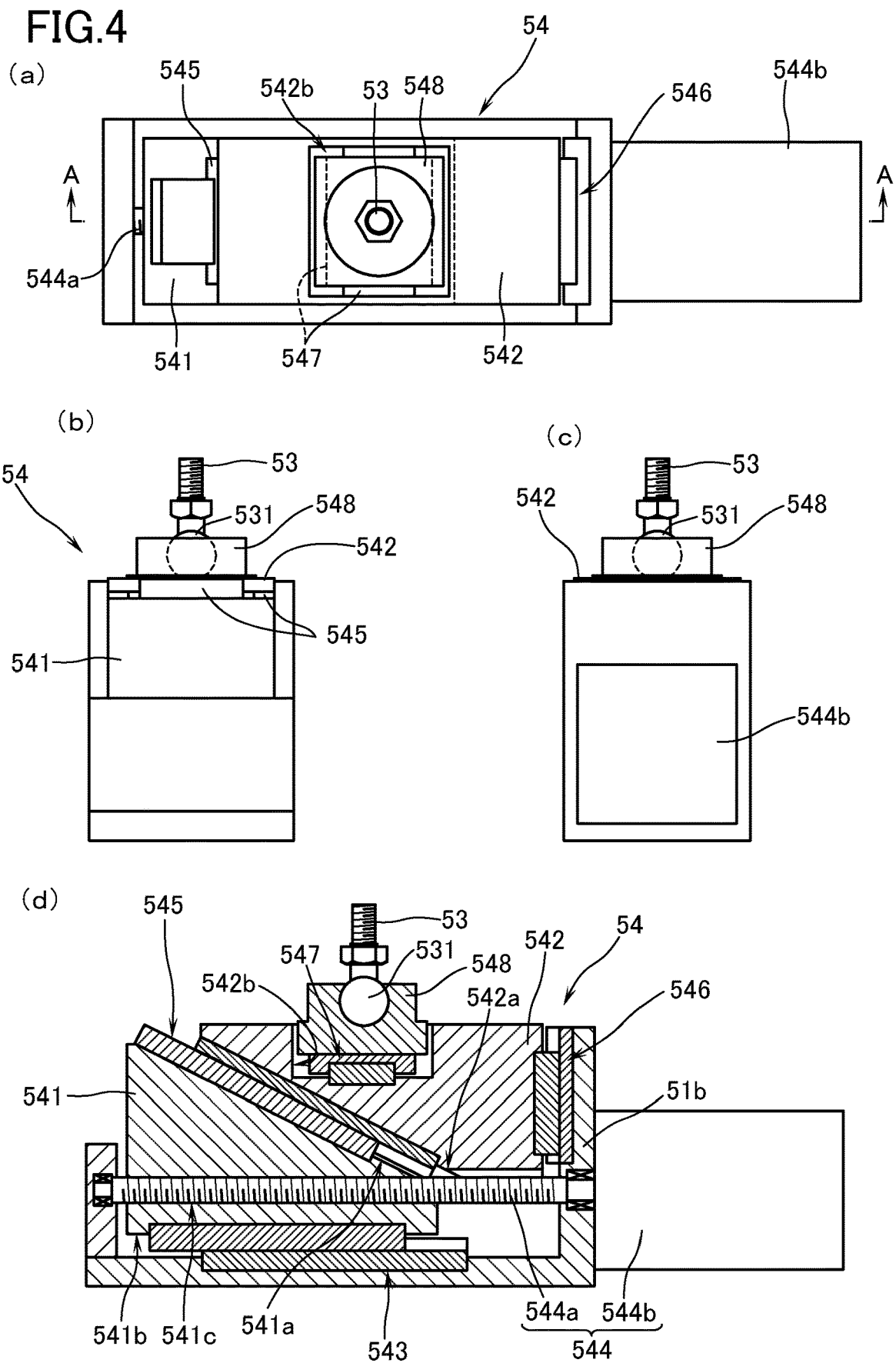
FIG. 4 (a) is a plan view of a drive unit, (b) is a front view of the drive unit, (c) is a rear view of the drive unit, and (d) is a sectional view along the line A-A as shown in FIG. 4 (a).

Here, in case a film is formed on the surface of the substrate W by sputtering the above-mentioned target 31, the sputtering rate (the amount of sputtered particles that are dispersed out of the sputtering surface 31a of the target 31 per unit time) in the region of relatively low density locally lowers. Therefore, this phenomenon must be restrained to the best extent possible. As a solution, in this embodiment, there is disposed a tilting means 5 for tilting the rotary shaft 44 relative to the center line C1 so that each of the magnets 42, 43 can be moved toward or away from the upper surface of the target 31 depending on the density distribution of the target 31 at the time of sintering of the raw material powder (see FIG. 2). Hereinbelow, the arrangement of the tilting means 5 will be described in concrete with reference to FIGS. 2 to 4.

The tilting means 5 is provided with a circular base plate 51 with a central opening 51a through which the rotary shaft 44 is penetrated. The base plate 51 is disposed, through an insulating material $1_3$, on an upper surface of the periphery of the backing plate 32. Above the base plate 51 there is disposed a tilting plate 52 at a distance therebetween. The tilting plate 52 is constituted by: a central base end portion 521 having substantially hexagonal profile; and three arm portions 522 which are disposed at an equal circumferential distance (at a distance of 120 degrees) to one another in a manner to protrude from the base end portion 521 radially outward. In this case, the base end portion 521 rotatably supports, through a bearing 521a, an upper portion of the rotary shaft 44 which protrudes upward beyond the base plate 51. Further, the lower surface 522a of the front end of the arm portion 522 has respectively disposed a tilting shaft 53 vertically. On the other hand, the base plate 51 is provided thereon with three drive units 54 which are adapted to tilt the tilting plate 52 through each of the tilting shafts 53.

Each of the drive units 54 has the same configuration and a description will be made of one drive unit 54 as an example. The drive unit 54 is provided with a first block 541 and a second block 542. The first block 541 and the second block 542 are constituted by dividing a block body of a rectangular parallelepiped into two so as to have tilted surfaces 541a, 542a of the same angle relative to the upper surface of the base plate 51. In order for the lower surface 541b of the first block 541 to extend in the tangential direction of the base plate 51, the first block 541 is mounted on the base plate 51 through a first linear guide 543. In this case, the first block 541 has formed therein a threaded hole 541c which extends in the tangential direction. This threaded hole 541c is engaged in a threaded manner with a feed screw 544a. When the feed screw 544a is rotated for driving by a drive motor 544b disposed at one end of the feed screw 544a, the first block 541 moves (transfers) in a front to back direction along the tangential direction. In this configuration, the feed screw 544a, drive motor 544b and the like constitute an actuator 544 of this embodiment.

The second block 542 is mounted, through a third linear guide 546, on a guide wall 51b which is vertically disposed upward on the base plate 51 with one side surface thereof vertically provided upward, in a state in which the tilted surface 542a of the second block is overlapped, through a second linear guide 545, with the tilted surface 541a of the first block 541. According to this arrangement, when the first block 541 is moved, the second block 542 will be guided by the second and the third linear guides 545, 646 to thereby displace in the vertical direction. Further, on the upper surface of the second block 542 there is formed in a recessed manner a receiving groove 542b which is elongated in a direction perpendicular to the tangential direction. The receiving groove 542b has formed therein, through a fourth linear guide 547, a block-shaped accepting portion 548. The lower end of the tilting shaft 53 is coupled to the accepting portion 548 through a ball joint 531. According to this arrangement, when any one of the second blocks 542 displaces upward or downward, the accepting portion 548 disposed in the receiving groove 542b of the other one (or two) of the second blocks 542 will be moved in one direction (radial direction) by being guided by the fourth linear guide 547. As a result, with the ball joint 531 serving as an origin, the tilting shaft 53 will be swung. Consequently, by appropriately adjusting the amount of movement of the first block 541, the tilting plate 52 can be tilted at an arbitrary angle in an arbitrary direction. Accordingly, the rotary shaft 44 can be tilted relative to the center line C1. By the way, since known art can be made use of as to each of the first to the fourth linear guides 543, 545, 545, 547, detailed description will be omitted here.

The above-mentioned sputtering apparatus SM has a control portion Cu which is provided with a microcomputer, sequencer, and the like so as to perform an overall control over the operation of the mass flow controller 12, the operation of the evacuating means P, the operation of the sputtering power source E, and the like. See FIG. 3. This control portion Cu: obtains the density distribution of the target 31 as described hereinafter; obtains the direction in which, and the angle at which, the tilting plate 52 shall be tilted depending on the obtained density distribution; and calculates the amount of movement of the first block 541 in order to materialize the above-mentioned direction and angle, thereby driving to control the actuator 544. A description will hereinafter be made of the method of forming a film by using the above-mentioned sputtering apparatus SM according to an embodiment of this invention.

Figure 5:
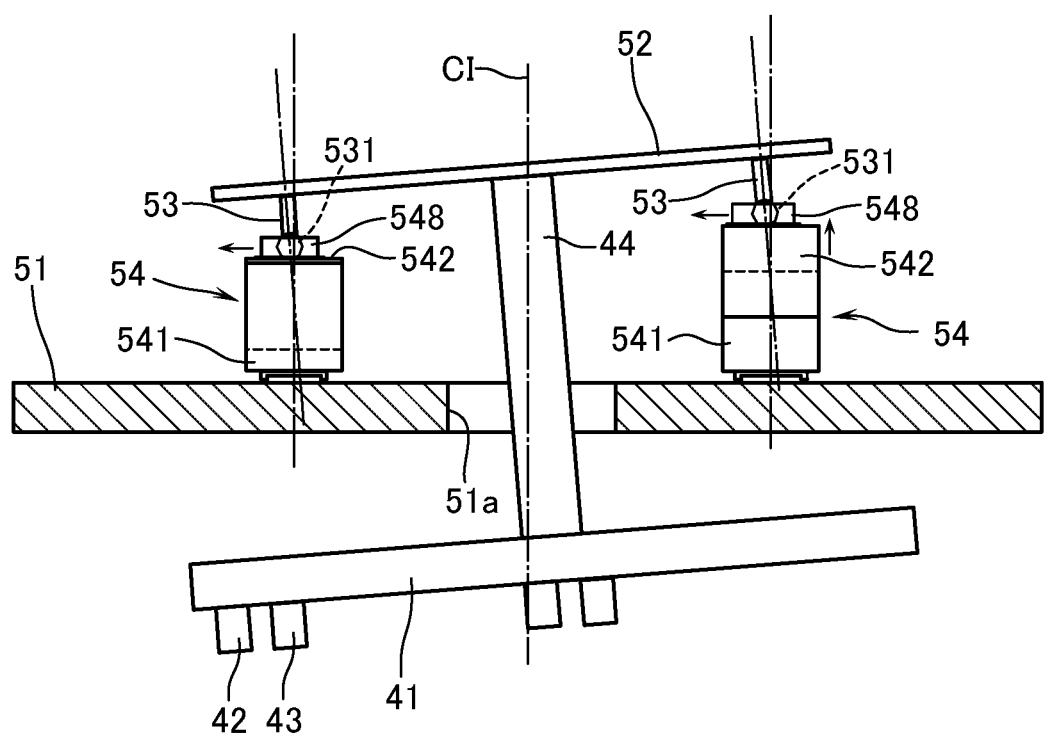
FIG. 5 is a schematic view to explain the motion of tilting the rotary shaft relative to the center line.

Prior to the film formation, the density distribution of the target 31 is obtained. As the method of obtaining the density distribution, it is possible not only to obtain the density distribution that was measured at the time of manufacturing the target 31, but also to calculate the film thickness distribution of the thin film (aluminum oxide film) that was formed on the substrate W by sputtering the target 31 in question in the posture shown in FIG. 1. The control portion obtains, depending on the obtained density distribution, the direction in which, and the angle at which, the rotary shaft 44 shall be tilted relative to the center line C1. The amount of movement of the first block 41 in order to materialize the obtained direction and the angle is calculated, thereby driving to control the actuator 544. In the example shown in FIG. 5, in case the density on the left side of the target 31 is low, the second block 542 is displaced in the vertical direction by moving the first block 541 on the right side. Due to its reaction force, the accepting portion 548 disposed in the receiving groove 542b of the left-side second block 542 moves in the radial direction (direction perpendicular to the surface of the paper) and thus the tilting shaft 53 swings with the ball joint 531 serving as an origin. As a consequence, the tilting plate 52 tilts such that the left side thereof lowers and, accompanied by this, the rotary shaft 44 tilts relative to the center line C1.

After having tilted the rotary shaft 44 in this manner, the substrate W is transferred onto the stage 2 by using a transfer robot (not illustrated), and the substrate W is fixed in position by the stage 2 and is kept maintained there. Then, by controlling the mass flow controller 12, argon gas is introduced by a predetermined flow rate (e.g., 100 to 200 sccm) (the pressure in the processing chamber 10 at this time will attain 1.8 to 2.2 Pa). At the same time, while rotating the magnet unit 4 about the tilted rotary shaft 44, radio frequency power of, e.g., frequency at 13.56 MHz is applied at 2 kW to 5 kW from the radio frequency power supply E to the target By forming a plasma inside the vacuum chamber 1, thereby sputtering the target 31. The sputtered particles dispersed by sputtering are thus caused to get adhered to, and deposited on, the surface of the substrate W, thereby forming an aluminum oxide film on the surface of the substrate W.

According to this embodiment, even if there locally exists a region in which the density is low in the target 31 in-plane for some reasons or other in the course of manufacturing the target, the rotary shaft 44 may be tilted relative to the center line C1 so that: when the magnets 42, 43 pass above the region of low density, the distance between the magnets 42, 43 and the target 31 is made relatively short and so that; when the magnets 42, 43 pass above the other regions, the distance between the magnets 42, 43 and the target 31 is made relatively long. In this manner, by varying the strength of the leakage magnetic field working on the target 31 depending on the density of the target 31, the sputtering rate over the entire circumference when the magnet unit 4 revolves about the imaginary circle can be made substantially uniform. As a result, when the sintered target 31 is sputtered to thereby form a film on the surface of the substrate W, the uniformity of film thickness distribution in the substrate W in-plane can further be improved. By the way, in locally varying the intensity of the leakage magnetic field that functions on the target 31, it may be considered to appropriately dispose a so-called magnetic shunt. However, since it cannot easily be recognized by visual inspection and the like as to which particular regions in the target 31 correspond to the region of low density, the idea of magnetic shunt is not practical.

Next, in order to confirm the above-mentioned effect, the following experiments were carried out by using the above-mentioned sputtering apparatus SM. In these experiments, just for the purpose of comparison, without tilting the rotary shaft 44 relative to the center line C1 (by disposing the rotary shaft 44 on the central line C1) as shown in FIG. 1, a silicon substrate of φ300 mm (in diameter) was used as the substrate W. After having set in position the substrate W on the stage 2 inside the vacuum chamber 1, argon gas was introduced into the processing chamber 10 at a flow rate of 200 sccm (the pressure inside the processing chamber 10 at this time was about 2.2 Pa), and radio frequency power of 13.56 MHz was applied at 4 kW to an aluminum oxide sintered target 31. According to this arrangement, a plasma was formed inside the processing chamber 10. While rotating the magnet unit 4 at a speed of 60 rpm, the target 31 was sputtered so that an aluminum oxide film was formed for 200 sec. on the surface of the substrate W. The film thickness distribution of the aluminum oxide film that was thus formed was measured to be 2.87%.

Figure 2:
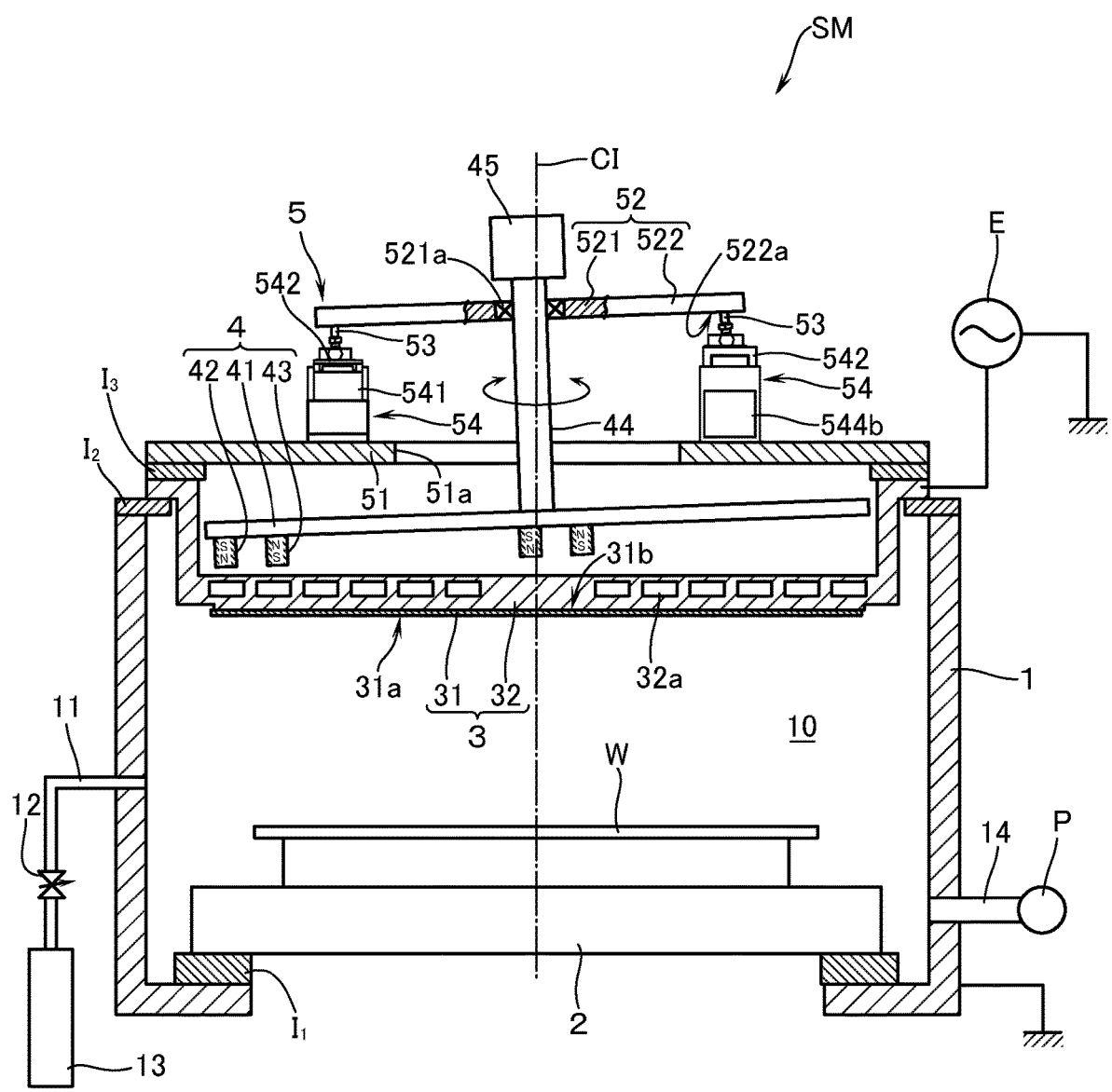
FIG. 2 is a schematic sectional view showing the sputtering apparatus in a
state in which the rotary shaft is tilted relative to the center line.

This film thickness distribution was obtained as the density distribution on the surface of the target 31, and the region in which the film thickness was relatively thin was regarded to be the region in which the density of the target was low. In order for the distance between the region of relatively low target density and the magnet to become smaller, the rotary shaft 44 was tilted relative to the center line C1 as shown in FIG. 2 and, thereafter, an aluminum oxide film was formed on the substrate W on the same conditions as those mentioned above. Upon measurement of the film thickness distribution of the aluminum oxide film that was formed with the rotary shaft 44 having been tilted as mentioned above, it was found to be 1.86%. It has been found that the uniformity of the film thickness distribution in the substrate in-plane was able to be improved further.

Descriptions have so far been made of the embodiment of this invention, but this invention shall not be limited to the above. In the above-mentioned embodiment, a description was made of an example in which an aluminum oxide film was formed by using the target 31 made of aluminum oxide. This invention can, however, be naturally applied to a case in which other thin films (insulating films) are formed by using other sintered targets.

In the above-mentioned embodiment, a description was made of the tilting means 5 based on an example which is provided with the base plate 51, the tilting plate 52, the tilting shaft 53, and the drive unit 54. Without being limited to the above, however, an arrangement can be used as long as the rotary shaft 44 can be tilted relative to the center line C1 in an arbitrary direction and at an arbitrary angle.

EXPLANATION OF MARKS

| C1 | center line | | |
|---|---|---|---|
| SM | sputtering apparatus | | |
| W | substrate to be processed | | |
| 1 | vacuum chamber | 31 | target |
| 31a | sputtering surface (surface to be sputtered) | | |
| 31b | upper surface of target | 4 | magnet unit |
| 42, 43 | magnet | 44 | rotary shaft |
| 45 | drive motor | 5 | tilting means |
| 51 | base plate | 51a | central opening |
| 52 | tilting plate | 53 | tilting shaft |
| 54 | drive unit | 541 | first block |
| 541a | tilted surface | 542 | second block |
| 544 | actuator | 548 | accepting portion |

The invention claimed is:
1. A sputtering apparatus comprising:
a vacuum chamber having a target manufactured by sintering raw material powder;
provided: that such a surface of the target as is eroded by sputtering is defined as a sputtering surface; that a thickness direction of the target is defined as a vertical direction; and that the target is non-rotatably mounted on the vacuum chamber in a posture in which the sputtering surface looks downward,
a magnet unit having a plurality of magnets disposed on a same surface above the target in order to cause leakage magnetic field penetrating the target to function in uneven distribution on the sputtering surface;
a rotary shaft disposed on a center line passing through a center of the target in a first position, for further coupling to the magnet unit;
a drive motor for driving the rotary shaft to rotate, thereby rotating the magnet unit such that a function region of the leakage magnetic field on the sputtering surface revolves about an imaginary circle that is concentric with the center of the target;
a control portion configured to obtain a direction in which, and an angle at which, a tilting plate is to be tilted; and
a tilting means for tilting the rotary shaft relative to the center line, based on the direction and the angle obtained by the control portion such that each of the magnets is moved toward or away from an upper surface of the target, the upper surface being opposite to the sputtering surface, in a second position;
wherein the tilting means comprises:
a base plate having formed therethrough a central opening through which the rotary shaft is inserted;
the tilting plate for supporting an upper portion of the rotary shaft which protrudes upward beyond the base plate;
at least three tilting shafts vertically disposed on a lower surface of the tilting plate at a circumferential distance from one another; and
at least three drive units, disposed on the base plate, for tilting the tilting plate relative to the center line through each of the at least three tilting shafts;
wherein each of the at least three drive units comprises:
a first block having a first tilted surface and disposed on the base plate so as to be movable by an actuator along the base plate;
a second block which vertically displaces along the first tilted surface of the first block as a result of movement of the first block,
wherein in the first position, the rotary shaft is perpendicular to the upper surface of the target, and coaxial to the center of the target, and
wherein the rotary shaft is tilted relative to the center line in the second position.

2. A method of forming a film comprising:
disposing inside a vacuum chamber a target manufactured by sintering raw material powder, and a substrate to be processed;
introducing a sputtering gas into the vacuum chamber;
sputtering the target by applying electric power to the target such that sputtered particles dispersed from the target are caused to be adhered to and deposited on a surface of the substrate to be processed;
provided: that such a surface of the target as is eroded by sputtering is defined as a sputtering surface; that a thickness direction of the target is defined as a vertical direction; and that a direction in which the sputtering surface faces is defined to be downward and the target is non-rotatably mounted on the vacuum chamber;
causing leakage magnetic field penetrating the target to function in uneven distribution on the sputtering surface by a magnet unit having a plurality of magnets disposed on a same surface above the target;
during film forming by sputtering, revolving the magnet unit about a rotary shaft disposed on a center line passing through a target center by a drive motor in a first position such that a function region of the leakage magnetic field relative to the sputtering surface revolves about an imaginary circle that is concentric with the target center,
obtaining by a control portion, prior to the film forming by sputtering, a direction in which and an angle at which a tilting plate is to be tilted; and
tilting the rotary shaft relative to the center line from the first position, based on the direction and the angle obtained by the control portion, and moving each of the magnets toward or away from an upper surface of the target, the upper surface being opposite to the sputtering surface in a second position,
wherein in the first position, the rotary shaft is perpendicular to the upper surface of the target, and coaxial to the center of the target, and
wherein the rotary shaft is tilted relative to the center line in the second position,
wherein the tilting comprises:
inserting the rotary shaft through a central opening in a base plate;
placing the tilting plate to support an upper portion of the rotary shaft which protrudes upward beyond the base plate;
disposing at least three tilting shafts vertically on a lower surface of the tilting plate at a circumferential distance from one another; and
disposing at least three drive units, on the base plate, for tilting the tilting plate relative to the center line through each of the at least three tilting shafts;
wherein each of the at least three drive units comprises:
a first block having a first tilted surface and disposed on the base plate so as to be movable by an actuator along the base plate;
a second block which vertically displaces along the first tilted surface of the first block as a result of movement of the first block.

* * * * *